United States Patent [19]

Henry et al.

[11] 4,141,135

[45] Feb. 27, 1979

[54] SEMICONDUCTOR PROCESS USING LAPPED SUBSTRATE AND LAPPED LOW RESISTIVITY SEMICONDUCTOR CARRIER

[75] Inventors: Raymond Henry; Jean-Victor Bouvet, both of Paris, France

[73] Assignee: Thomson-CSF, Paris, France

[21] Appl. No.: 731,213

[22] Filed: Oct. 12, 1976

[30] Foreign Application Priority Data

Oct. 14, 1975 [FR] France ............................. 75 31411

[51] Int. Cl.² .................. H01L 21/304; H01L 23/36
[52] U.S. Cl. ........................................ 29/580; 29/583; 29/589; 29/591; 357/56; 357/71; 357/81
[58] Field of Search ................. 29/580, 583, 589, 591; 357/56, 81

[56] References Cited

U.S. PATENT DOCUMENTS

| 3,343,255 | 9/1967 | Donovan | 357/49 |
|---|---|---|---|
| 3,445,303 | 5/1969 | Engbert | 357/56 |
| 3,559,282 | 2/1971 | Lesk | 357/81 |
| 3,609,474 | 9/1971 | Vincent, Jr. | 357/81 |
| 3,689,993 | 9/1972 | Tolar | 357/81 |
| 3,775,200 | 11/1973 | de Nobel et al. | 357/56 |
| 3,908,187 | 9/1975 | Sheldon et al. | 357/81 |
| 4,035,830 | 7/1977 | Kim | 357/81 |

FOREIGN PATENT DOCUMENTS

| 2232081 | 12/1974 | France. |
|---|---|---|
| 807728 | 1/1959 | United Kingdom. |
| 863119 | 3/1961 | United Kingdom. |
| 992963 | 5/1965 | United Kingdom. |
| 1120488 | 7/1968 | United Kingdom. |
| 1126338 | 9/1968 | United Kingdom. |
| 1281010 | 7/1972 | United Kingdom. |
| 1295892 | 11/1972 | United Kingdom. |

*Primary Examiner*—William D. Larkins
*Attorney, Agent, or Firm*—Oblon, Fisher, Spivak, McClelland & Maier

[57] ABSTRACT

A process intended for avoiding the "flip chip bonding" technique, well known for planar diodes, is provided. It is further applicable to mesa diodes and planar transistors. It comprises an essential step: the lapping of the substrate up to reduce its thickness to the same order of magnitude as the upper active layer of a semiconductor device, thus facilitating the cooling of the device through the substrate towards a heat sink. This essential step is made possible by virtue of a preliminary bonding on the upper layer of the semiconductor device of a block of silicon. According to a first alternative of the invention the block is finally eliminated and the device is a conventional one with a very thin substrate. According to a second alternative of the invention, the block is retained and lapped after addition of the heat sink, then metalized to provide a secondary way to the thermal flux.

3 Claims, 11 Drawing Figures

SEMICONDUCTOR PROCESS USING LAPPED SUBSTRATE AND LAPPED LOW RESISTIVITY SEMICONDUCTOR CARRIER

This invention relates to a process for producing semiconductor devices with a very low thermal resistance. The object of the invention is distinctly to improve the conditions under which the heat produced in an electronic component (diode, transistor or even a more complex semiconductor device) during operation is dissipated.

It is known that power diodes, especially hyperfrequency power diodes, can be produced by a process known as "flip chip bonding". A diode produced by this process comprises an active part mounted on a semiconductor base, the substrate. The process comprises bonding the diode onto a wide, thick and heat-conductive metal support (copper, silver) so as to facilitate the flow of heat towards earth by applying against the support not the substrate, but instead the flat surface defining the active part so as to reduce the flow path and hence the thermal resistance.

This process is not applicable to transistors because the metal support would short-circuit the electrodes present on the flat surface.

The present invention obviates this disadvantage and, in addition, has advantages in the case of diodes which will become apparant hereinafter.

According to the invention, there is provided a process for producing semiconductor devices with a very low thermal resistance, said process starting from a device consisting of a semiconductor substrate and an active part formed by semiconductive layers, the thickness of the substrate being considerable in relation to that of the active part, said process comprising at least the following steps:

(a) bonding a block of a semiconductor material onto said active part;

(b) lapping the substrate so as to reduce its thickness, the device remaining easy to handle by virtue of the block bonded in step (a);

(c) finishing the device.

According to other aspects of the invention, there are two possible alternatives for step (c).

First alternative; the block bonded in step (a) is discarded and, after bonding a highly heat-conductive base on the substrate side, the flow of heat takes place through the substrate thinned down in step (b) from the active part towards the base, which gives a device with unilateral thermal dissipation.

Second alternative: the block bonded in step (a) is retained and is lapped following the addition, on the substrate side, of a base similar to that used in the first alternative; in this case, however, the lapped part of the block is metallised which affords an additional possibility of heat flow from the side on which this metal coating is deposited (bilateral thermal dissipation).

The invention will be better understood from the following description in conjunction with the accompanying drawings, wherein.

Generally, the examples given hereinafter enable the process according to the invention to be collectively applied, i.e. to a great number of devices fabricated in the same semiconductive wafer.

Figure 1:
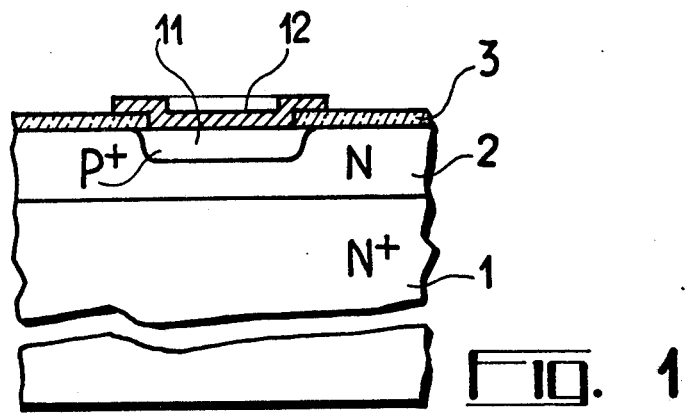
FIGS. 1 to 7 are diagrammatic sections through devices in various steps of production by the process according to the invention in the case of diodes.

FIG. 1 shows, partly in section, a silicon wafer on which the following preliminary treatments were carried out in steps preceding step (a) of the process:

the deposition by epitaxy of a layer 2 of silicon with N-type doping onto a substrate 1 of silicon forming said wafer, the substrate itself having $N^+$-type doping;

the formation or deposition by a known process of a thin layer of silicon oxide covering the entire surface of the layer 2;

the diffusion of impurities P into the minor regions 11 ($P^+$) of the layer 2 through openings formed by photoetching in the layer 3;

the metallisation of a zone 12 projecting slightly beyond the access opening to the minor region 11; in the example selected, the metal used for this purpose is pure gold with a buffer layer (Mo, Ta, W), not shown, between the gold and the silicon.

The device shown in FIG. 1 represents the starting point of step (a) of the process according to the invention (case of a plane diode).

Figure 2:
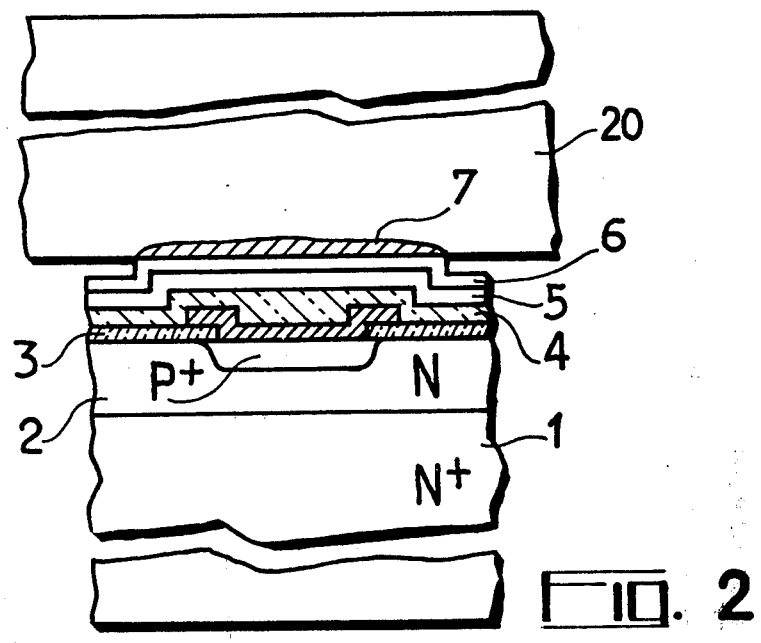

The treatment to which the device is subjected in step (a) depends upon the alternative adopted. In particular, in the case of the first alternative (in which the block does not remain in the final device), the block of silicon is not directly bonded onto the metallisation 12. This case is illustrated in FIG. 2. Three successive layers have been introduced between the initial device and a block 20 of silicon:

a layer 4 of glass of the type used for passivating semiconductor devices; this layer covers the entire wafer;

a thin layer of chromium 5;

a layer 6 of gold covering the layer 5.

When the block 20 is bonded onto the disc, an intermediate zone 7 consisting of an alloy of gold silicon is formed, contributing towards firmly fixing the block on the wafer.

Figure 3:
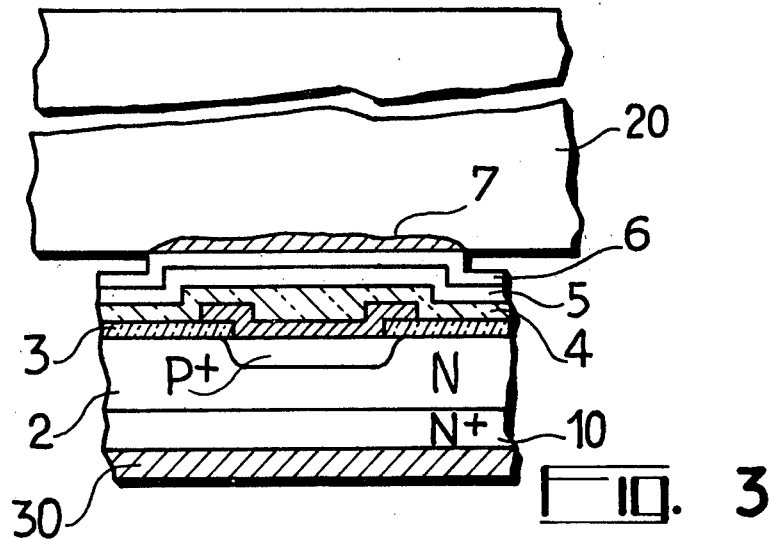
Figure 4:
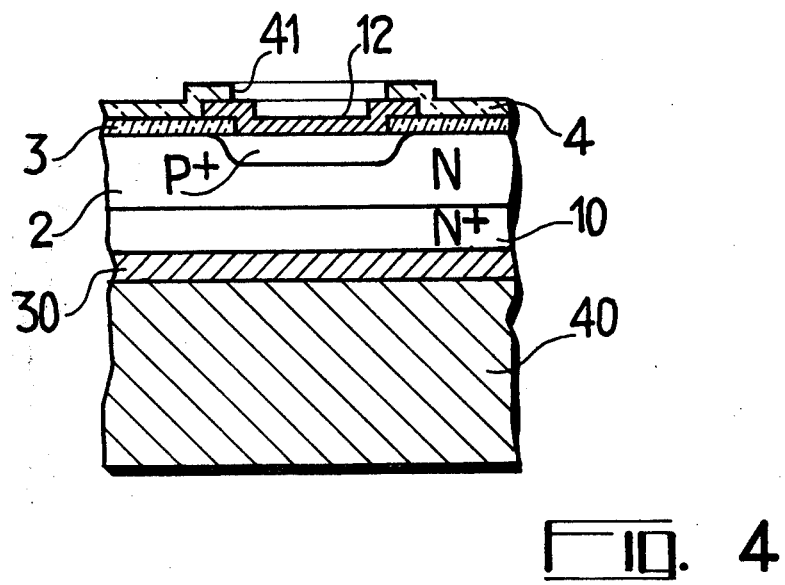

The finishing of the device, in the case of the first alternative, is illustrated in FIGS. 3 and 4:

FIG. 3 which shows in section part of the wafer issuing from the preceding step after lapping of the substrate 1 (step b) reduced to a layer 10 with a thickness of the order of 10 to 20 microns; this layer was covered with a layer 30 of highly conductive metal;

FIG. 4 which shows a single device obtained by cutting from the wafer issuing from the preceding step after having been subjected to the following treatments:

application of a thick layer 40 of hightly conductive metal, for example by the electrolytic deposition of gold;

elimination of the block 20, for example by chemical attack, the wafer being protected by the layers 5 and 6;

opening by photoetching access windows 41 to the metal coatings 12.

Figure 5:
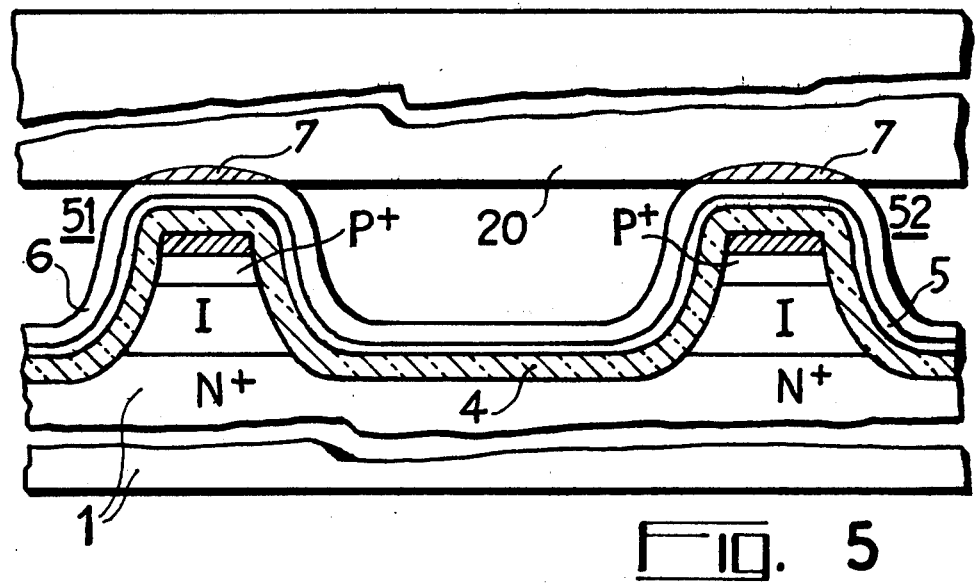

The process according to the invention is also applicable to mesa diodes, irrespective of the alternative adopted. In the case of the first alternative, FIG. 5 shows how a block 20 of silicon is bonded to the peaks of the mesa diodes of the same disc, only two diodes 51 and 52 being shown. The bonding is effective by virtue of the islets of gold-silicon alloy 7.

In the case of the second alternative (in which the block is retained), the steps of the process are different, according to whether the diodes are plane diodes or mesa diodes:

1. Plane diodes

The steps are as follows:

(a) bonding of the block 20 directly onto the gold of the metal coatings 12, resulting in the formation of a gold-silicon eutectic;

(b) lapping of the $N^+$ substrate in the same way as in the first alternative;

(c) finishing of the devices comprising the following secondary steps:

($c_1$) depositing a layer of highly heat conductive metal onto the lapped substrate;

($c_2$) forming a heat dissipation base in the same way as in the first alternative;

($c_3$) lapping of the block 20 (of low-resistivity silicon) and metallisation of the lapped surface by a hightly heat conductive metal, which creates a second heat flow path.

Figure 6:
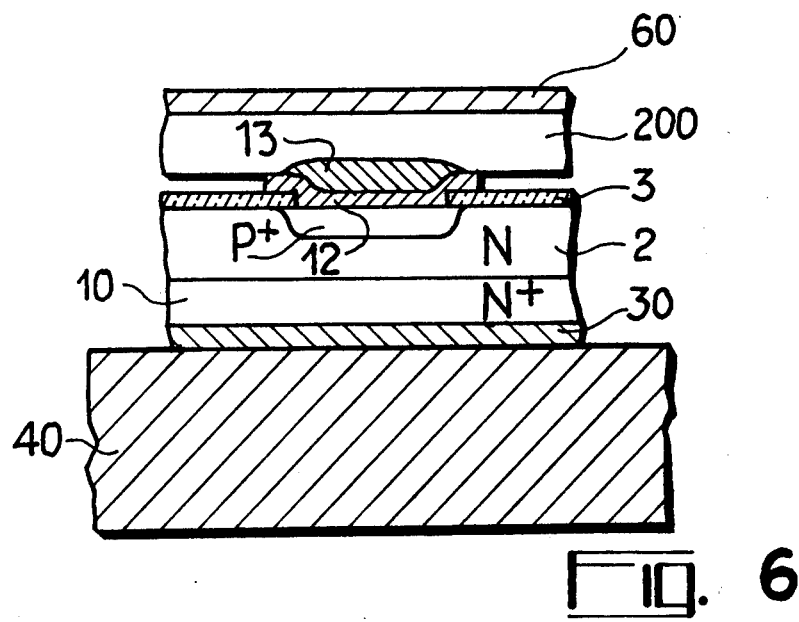

FIG. 6 illustrates the single device showing the metallisation 12, the gold-silicon eutectic 13, the remaining part 10 of the $N^+$ substrate, the layer of metal 30 deposited in step ($c_1$), the heat dissipation base 40, the remaining part 200 of the block of silicon and the metal coating 60 deposited in step ($c_3$).

2. Mesa diodes

In this case, the starting diodes are mesa diodes of which the edges are protected by a passivation layer 14 (FIG. 7) for example of glass which has been directly cast onto the silicon, the silicon having been exposed by "mesa attack" during the formation of the diode.

In a preliminary step, a "flat" mesa diode is formed by depositing a thick layer of glass 15 which fills the gaps between the peaks of the diodes of the wafer.

Figure 7:
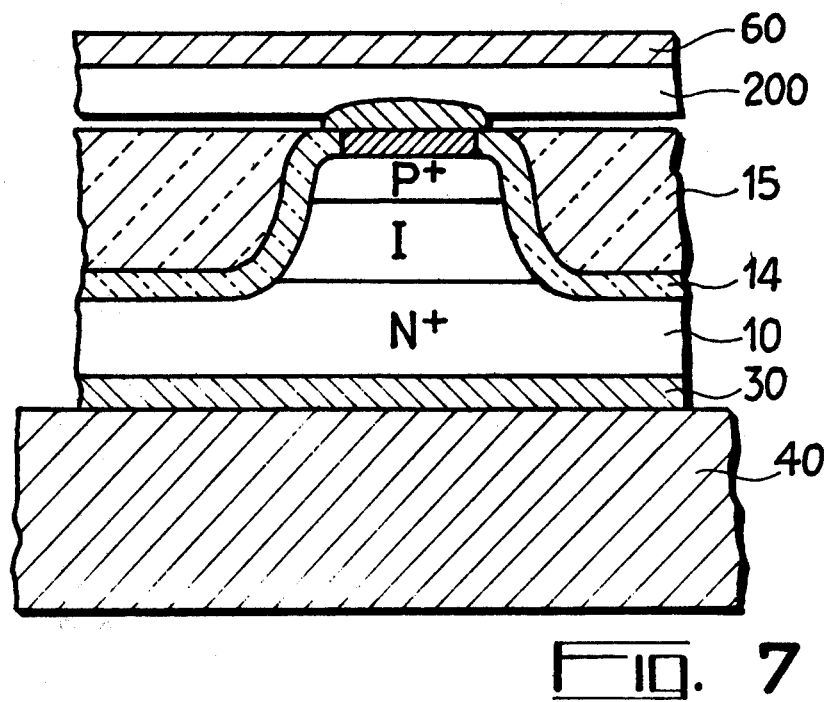

The following steps are then identical with those of the preceding case. Using the same references as in FIG. 6, FIG. 7 shows the corresponding components of the devices, in particular the metal deposits 40 and 60 which provide for bilateral thermal dissipation.

Figure 8:
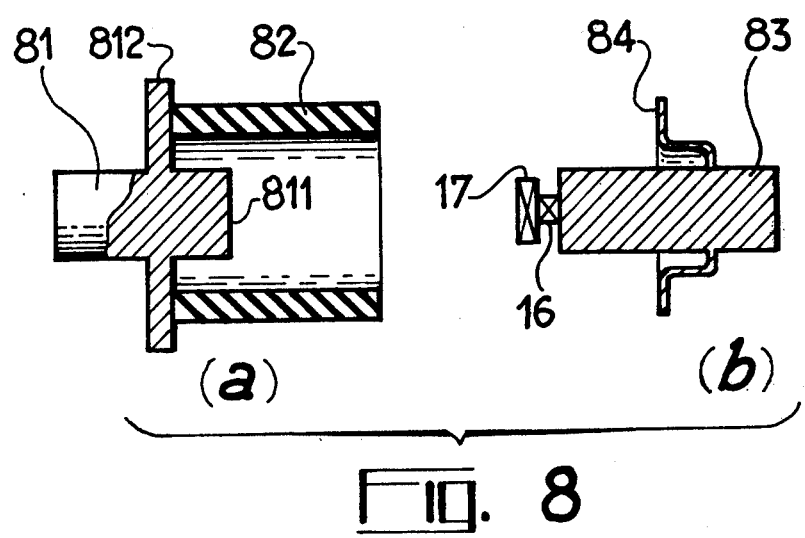
FIGS. 8 and 11 show, in section, housings for devices according to the invention.

FIG. 8 shows by way of non-limiting example a diode housing which facilitates connection and heat flow in operation. It comprises:

a female portion comprising a heat dissipation body 81 with a flange 812, the whole consisting of a highly heat conductive and electrically conductive metal, such as copper or silver. A sleeve 82 of an electrically insulating material which suitably conducts the heat generated, such as beryllium oxide, is welded to the flange, in the base of which is situated the flattened end 811 of the base 81;

a male portion 83 with a flexible flange 84. The diode 16 with its base 17 is fixed for example to the flattened end of the male portion intended to enter the sleeve 82 which is fixed by means of the flexible flange 84.

The process according to the invention is also applicable to transistors. In the case of the first alternative (block removed), the steps of the process are the same as for the diodes: in effect, the various electrodes (for example the base and emitter on the active surface of a plane transistor, the collector being on the substrate side) are insulated from one another and are protected by the initial glass layer. In the case of the second alternative (block retained), the process is applicable by using a block of high-resistivity silicon which does not completely cover the electrodes so as to facilitate the lateral connection of the electrical leads.

Figure 9:
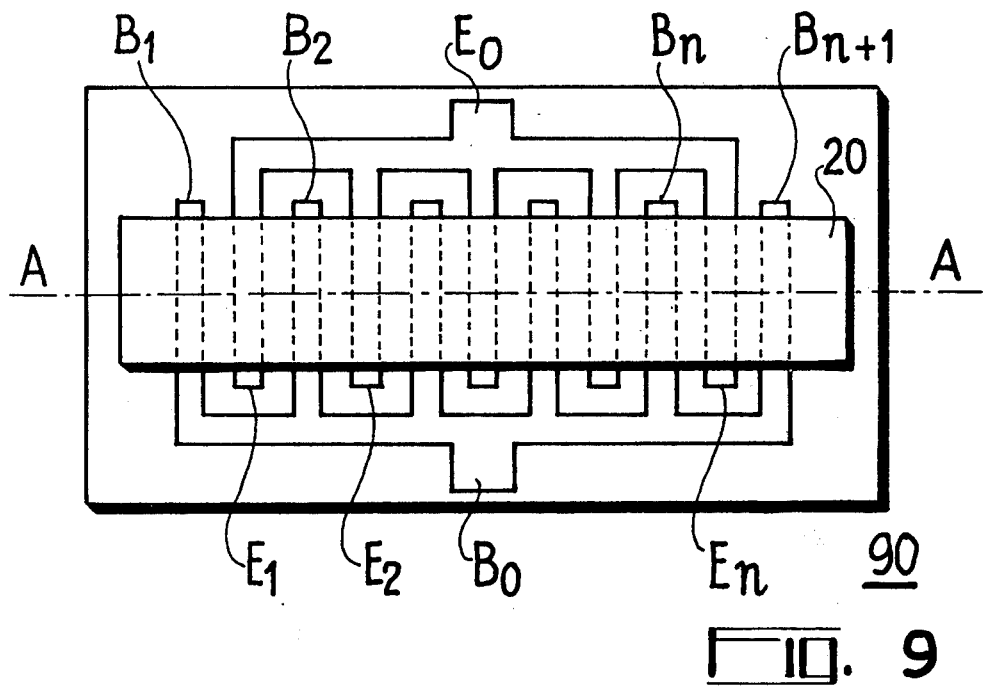
FIGS. 9 and 10 show, in plan view and in section, respectively, the application of the process according to the invention to the case of transistors.

By way of example, FIG. 9 shows, in a plane view, a plane transistor 90 of which the emitter forms a first comb with n fingers $E_1, E_2 \ldots E_n$ and of which the base forms a second comb with n + 1 fingers $B_1, B_2 \ldots B_n, B_{n+1}$, between which the fingers of the first comb are interleaved. A block of silicon 20 is bonded to the transistor 90 on a portion of its active surface which only covers the fingers, leaving free their common stumps $E_0$ and $B_0$.

Figure 10:
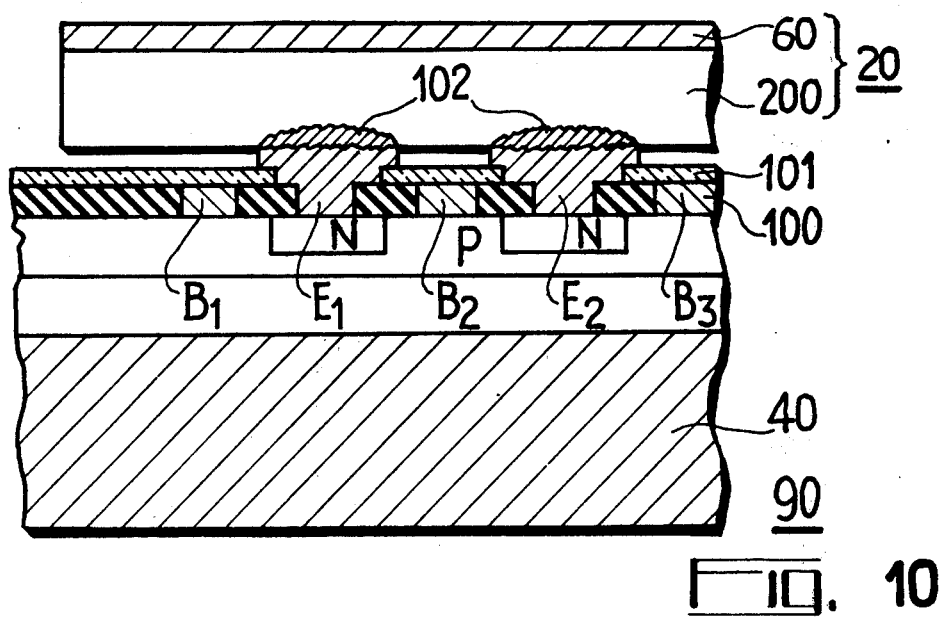

FIG. 10 shows part of a section through the transistor 90 along a line AA on the plane of FIG. 9. It shows a layer P in electrical contact with the fingers $B_1, B_2, B_3$, and zones N electrically connected to the fingers $E_1, E_2$. In addition to the silica (layer 100) extending between the base and emitter fingers, there is a layer of glass 101 with windows which only lay bare the emitter fingers. In these windows, the emitter fingers have been covered by metal deposits 102 of gold. As in the case of the diodes, the block of silicon 20 has been bonded to these metal deposits. Since the transistor 90 is shown in its finished state, there only remain thin layers of substrate N and silicon 200 covered respectively by the metal layers 40 and 60.

Figure 11:
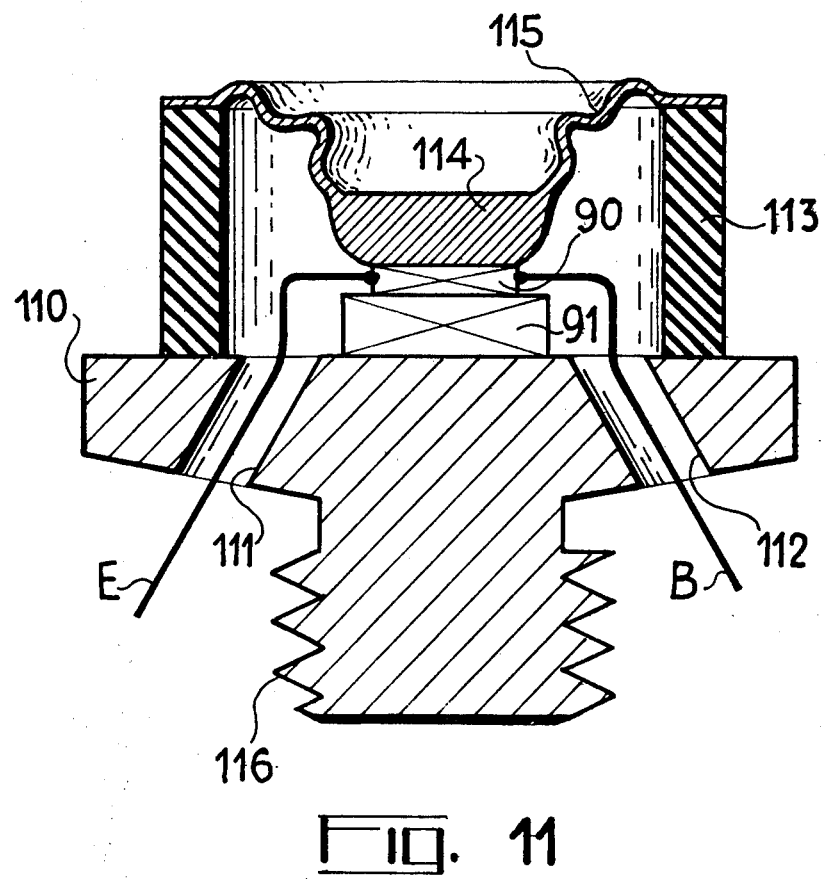

FIG. 11 shows by way of example a housing 11 for a transistor such as that shown in FIGS. 9 and 10, i.e. with bilateral thermal dissipation. It comprises a thick circular platform 110 mounted on a base of the "screw" type 116. The platform is formed with openings 111 and 112 intended for the exit of the emitter and base connections E and B coming from the transistor 90 bonded to a base 91. The active surface of the transistor 90 is bonded to a metal cover 114 of copper comprising a thinner "extensible" periphery 115 bonded to the free end of a sleeve 113 of beryllium oxide carried by the platform 110 and surrounding the transistor and the cover.

At very high frequency, it can readily be seen, by referring to FIG. 10, that the metal coating 60 contributes towards creating a parasitic capacitance between the base and emitter electrodes, which adversely affects the performance of the transistor. It is possible to obviate this disadvantage by polarising the metal coating 60 in such a way as to create a depletion zone in the layer 200.

The invention is applicable with semiconductor materials other than silicon both in regard to the substrate and in regard to the block 20 which may be fixed by suitable bonding means.

Finally, it is possible to replace the block 20 of silicon by a thermoelement, for example a thin plate of bismuth telluride which does not have to be lapped because it may be cooled by passing a suitable electrical current through its body.

What we claim is:

1. A process for producing semiconductor devices of planar diode type, with a very low thermal resistance, starting from a wafer consisting of a substrate, at least one active layer of semiconductor material exhibiting electrodes and a metal coating, said process comprising the following steps:

(a) bonding of a block of low resistivity semiconductor material onto said active part;

(b) lapping of said substrate;

(c) finishing the device according to the following sub-steps:

($c_1$) depositing a first layer of highly heat conductive metal onto the lapped substrate;

($c_2$) depositing a second layer of low resistivity metal onto said first layer;

($c_3$) lapping of the block;
($c_4$) metallising the lapped block surface by a highly heat conductive metal.

2. A process for producing semiconductor devices of mesa diode type with a very low thermal resistance, starting from a wafer consisting of a substrate supporting mesa diode structures protected by a passivation layer except at the tops of the mesa structures whereon a metallic coating is deposited, said process comprising the following steps:
   (a) depositing a thick layer of glass between said mesa structures filling the gaps between said structures and laying bare said metal coatings;
   (b) bonding of a block of low resistivity semiconductor material onto said metal coatings;
   (c) lapping of said substrate;
   (d) finishing the device according to the following sub-steps:
      ($d_1$) depositing a first layer of highly heat conductive metal onto the lapped substrate;
      ($d_2$) depositing a second layer of low resistivity metal onto said first layer;
      ($d_3$) lapping of the block;
      ($d_4$) metallising the lapped block surface by a highly heat conductive metal.

3. A process for producing semiconductor devices of transistor type, with a very low thermal resistance, starting from a transistor device comprising a substrate, interleaved emitter and base regions and finger shaped metallisations in contact with said regions and leading respectively to a common emitter stump and to a common base stump, said process comprising the following steps:
   (a) depositing a layer of insulating material onto said finger shaped metallisations;
   (b) forming windows in said layer, laying bare said emitter fingers;
   (b) bonding a block of low resistivity semiconductor material onto said metallisation, partially covering said finger shaped metallisations;
   (d) lapping of said substrate;
   (e) finishing of the device according to the following sub-steps:
      ($e_1$) depositing a first layer of highly conductive metal onto the lapped substrate;
      ($e_2$) depositing a second layer of low resistivity metal onto the first layer;
      ($e_3$) lapping of the block;
      ($e_4$) metallising of the lapped block surface by a highly heat conductive metal.

* * * * *